US009798969B2

United States Patent
(12) Sakai

(10) Patent No.: US 9,798,969 B2
(45) Date of Patent: Oct. 24, 2017

(54) INFORMATION PROCESSING DEVICE AND COMMUNICATION DEVICE

(71) Applicant: SONY CORPORATION, Tokyo (JP)

(72) Inventor: Yuji Sakai, Saitama (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/103,364

(22) PCT Filed: Dec. 1, 2014

(86) PCT No.: PCT/JP2014/081722
§ 371 (c)(1),
(2) Date: Jun. 10, 2016

(87) PCT Pub. No.: WO2015/093268
PCT Pub. Date: Jun. 25, 2015

(65) Prior Publication Data

US 2016/0307091 A1 Oct. 20, 2016

(30) Foreign Application Priority Data

Dec. 20, 2013 (JP) ................................ 2013-263240

(51) Int. Cl.
*H01L 23/02* (2006.01)
*G06K 19/077* (2006.01)
*H01L 23/498* (2006.01)
*H01L 23/66* (2006.01)

(52) U.S. Cl.
CPC .. *G06K 19/07749* (2013.01); *H01L 23/49822* (2013.01); *H01L 23/49855* (2013.01); *H01L 23/66* (2013.01); *H01L 2223/6677* (2013.01)

(58) Field of Classification Search
CPC ......... H01L 23/49822; H01L 23/49855; H01L 23/66; H01L 2223/6677; G06K 19/07749
See application file for complete search history.

(56) References Cited

FOREIGN PATENT DOCUMENTS

| | | |
|---|---|---|
| JP | 2002-083277 A | 3/2002 |
| WO | 2008/047338 A | 4/2008 |
| WO | 2010/001987 A | 1/2010 |

*Primary Examiner* — Victor A Mandala
*Assistant Examiner* — Colleen E Snow
(74) *Attorney, Agent, or Firm* — Chip Law Group

(57) ABSTRACT

An information processing device that includes a coil antenna is configured to receive an external magnetic field and thereby generate power, and a first IC chip and a second IC chip each connected in parallel to the coil antenna and configured to receive power supplied from the coil antenna. Power received by the first IC chip from the coil antenna is different from power received by the second IC chip from the coil antenna.

10 Claims, 4 Drawing Sheets

200
111
110
100
120a
120b

INFORMATION PROCESSING DEVICE AND COMMUNICATION DEVICE

CROSS REFERENCE TO RELATED APPLICATIONS

This application is a U.S. National Phase of International Patent Application No. PCT/JP2014/081722 filed on Dec. 1, 2014, which claims priority benefit of Japanese Patent Application No. JP 2013-263240 filed in the Japan Patent Office on Dec. 20, 2013. Each of the above-referenced applications is hereby incorporated herein by reference in its entirety.

TECHNICAL FIELD

The present disclosure relates to information processing devices and communication devices.

BACKGROUND ART

IC tags, which include an IC chip for performing contactless communication with a nearby reader/writer to perform a process such as authentication or the like, have been widespread. In particular, so-called passive IC tags, which do not have a power supply such as a battery or the like and is activated by power that is accumulated and stored in a capacitor or the like by receiving radio waves from a reader/writer, have been widespread because of their good usability.

An IC tag is constructed by mounting parts such as an IC chip for performing a communication process and the like on a circuit board on which an antenna pattern for receiving radio waves from a reader/writer is formed. The antenna pattern is in the shape of a coil and has a relatively large area on the circuit board in order to efficiently receive radio waves from a reader/writer. Typically, parts such as an IC chip, a capacitor, and the like are provided in a center portion surrounded by the coil-shaped antenna pattern. When an authentication process is performed using an IC tag, the IC tag performs a communication process on its own, e.g., information stored in a memory included in the IC chip is transmitted to a reader/writer, and information transmitted from the reader/writer is written to the memory of the IC chip.

As described above, IC tags can wirelessly communicate with a reader/writer on their own. For example, card-shaped objects including a circuit board implemented as an IC tag are widely used as electronic money cards, tickets, authentication cards, and the like. Also, various electronic devices such as mobile telephone terminals and the like which include an IC tag are similarly widely used.

A plurality of standards for IC chips that perform contactless communication are provided for different applications and the like. A technique has been proposed that equips a single device with a plurality of IC chips for performing contactless communication according to different standards and thereby allows the single device to perform contactless communication using a plurality of communication schemes (see, for example, Patent Literature 1 and the like).

CITATION LIST

Patent Literature

Patent Literature 1: JP 2002-83277A

SUMMARY OF INVENTION

Technical Problem

If a plurality of IC chips for performing contactless communication are provided, power received from the antenna needs to be appropriately supplied to the IC chips according to communication characteristics required for the respective IC chips.

With the above in mind, the present disclosure proposes a novel and improved information processing device and communication device that, when a plurality of IC chips for performing contactless communication are connected to a single coil antenna, can appropriately supply power to the IC chips according to communication characteristics required for the respective IC chips.

Solution to Problem

According to the present disclosure, there is provided an information processing device including: a coil antenna configured to receive an external magnetic field and thereby generate power; and a first IC chip and a second IC chip each connected in parallel to the coil antenna and configured to receive power supplied from the coil antenna. Power received by the first IC chip from the coil antenna is different from power received by the second IC chip from the coil antenna.

According to the present disclosure, there is provided a communication device including: a coil antenna configured to receive an external magnetic field and thereby generate power; a first IC chip and a second IC chip each connected in parallel to the coil antenna and configured to receive power supplied from the coil antenna; and an outer material configured to cover the coil antenna and the two or more IC chips. Power received by the first IC chip from the coil antenna is different from power received by the second IC chip from the coil antenna.

Advantageous Effects of Invention

As described above, according to the present disclosure, a novel and improved information processing device and communication device can be provided that, when a plurality of IC chips for performing contactless communication are connected to a single coil antenna, can appropriately supply power to the IC chips according to communication characteristics required for the respective IC chips.

Note that the effects described above are not necessarily limited, and along with or instead of the effects, any effect that is desired to be introduced in the present specification or other effects that can be expected from the present specification may be exhibited.

DESCRIPTION OF EMBODIMENTS

Hereinafter, (a) preferred embodiment(s) of the present disclosure will be described in detail with reference to the appended drawings. In this specification and the drawings, elements that have substantially the same function and structure are denoted with the same reference signs, and repeated explanation is omitted.

Note that description will be provided in the following order.

1. Embodiments of the Present Disclosure
   1.1. Configuration Examples of Information Processing Device
   1.2. Advantageous Effect Examples
   1.3. Specific Structure Examples
2. Conclusion

1. EMBODIMENTS OF THE PRESENT DISCLOSURE

[1.1. Configuration Examples of Information Processing Device]

Figure 4:
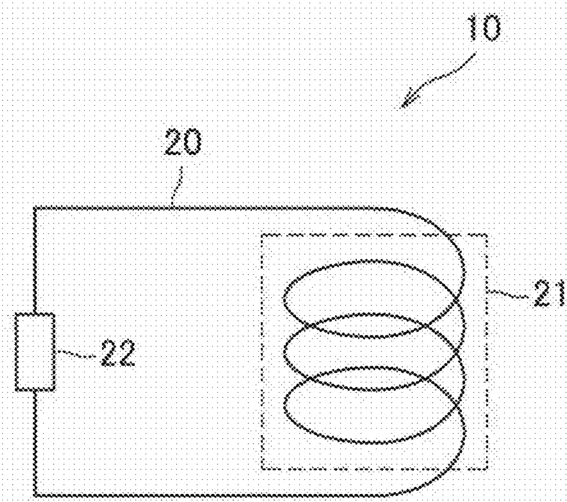
FIG. 4 is an illustrative diagram showing a configuration example of an information processing device.

FIG. 4 is an illustrative diagram showing a circuit configuration example of an information processing device 10 including a single IC chip for performing contactless communication. In the information processing device 10 shown in FIG. 4, an IC chip 22 for performing contactless communication is connected to a coil antenna 20 including a coil 21, and operates using supplied power that is generated in the coil antenna 20 by electromagnetic induction.

When a plurality of IC chips for performing contactless communication are provided instead of a single IC chip, then if the IC chips are simply connected in parallel to the coil-shaped coil antenna, power that is generated by the coil antenna and supplied to the respective IC chips, is uniquely determined according to characteristics of operating circuits included in the respective IC chips. For different IC chips for performing contactless communication, there are different requirements in terms of a communication characteristic such as a communication coverage distance, or the presence or absence and width of a communication dead zone within a communication coverage area. If IC chips are simply connected in parallel to the coil-shaped coil antenna, power supplied to the respective IC chips is uniquely determined, so that, for some of the IC chips, the required communication characteristic may not be satisfied.

With the above in mind, an information processing device according to an embodiment of the present disclosure described below has a feature that when a plurality of IC chips are connected to a coil antenna instead of a single IC chip, an adjustment is made to allow the IC chips to appropriately receive power supplied from the coil antenna according to communication characteristics required by the respective IC chips.

Figure 1:
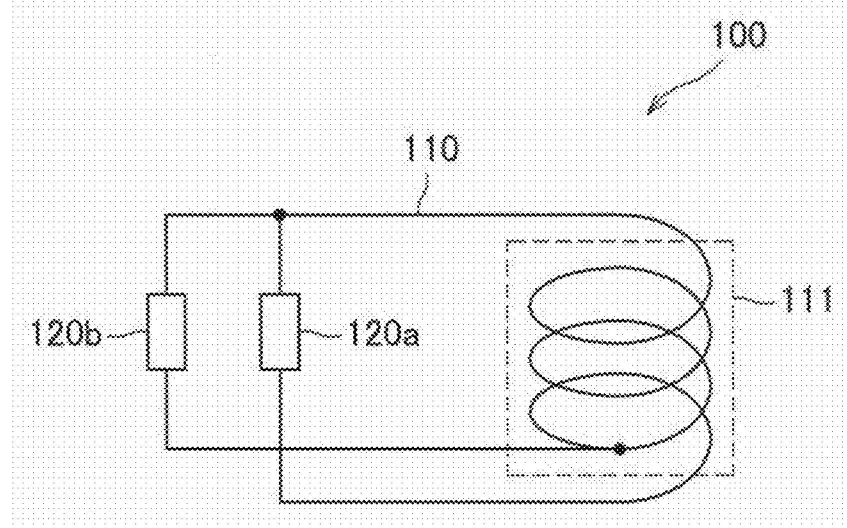
FIG. 1 is an illustrative diagram showing a configuration example of an information processing device according to an embodiment of the present disclosure.

Next, a configuration example according to an embodiment of the present disclosure will be described. FIG. 1 is an illustrative diagram showing a configuration example of an information processing device according to an embodiment of the present disclosure. The configuration example of the information processing device 100 according to an embodiment of the present disclosure will be described with reference to FIG. 1.

The information processing device 100 according to an embodiment of the present disclosure shown in FIG. 1 is incorporated into, for example, a card having a shape determined according to a predetermined standard, or an electronic device such as a mobile telephone, a smartphone, or the like. FIG. 1 schematically shows a circuit diagram of the information processing device 100 according to an embodiment of the present disclosure. The information processing device 100 shown in FIG. 1 may be, for example, an inlet enclosed by an outer material such as a plastic card or the like. The information processing device 100 according to an embodiment of the present disclosure shown in FIG. 1 includes a coil antenna 110 and two IC chips 120*a* and 120*b*.

The coil antenna 110, which is constructed by, for example, winding a band-shaped conductive film into a helix receives a magnetic field generated by a reader/writer (not shown) using a coil 111 to generate power by electromagnetic induction. Although not shown in FIG. 1, interconnects, and internal circuits of the IC chips 120*a* and 120*b*, in the information processing device 100, have capacitances. These capacitances and the inductance of the coil 111 determine the resonant frequency of the information processing device 100. It is assumed that the resonant frequency of the information processing device 100 is set to, for example, 13.56 MHz. Power generated by the coil 111 is supplied to the IC chips 120*a* and 120*b*, and is used to operate the IC chips 120*a* and 120*b*.

The IC chips 120*a* and 120*b* are a communication circuit including a circuit for performing a contactless wireless communication process with a reader/writer (not shown). As shown in FIG. 1, in the information processing device 100 according to this embodiment, the two chips 120*a* and 120*b* are connected to the single coil antenna 110.

The IC chips 120*a* and 120*b* each include a circuit suited to a communication characteristic that should be satisfied for a corresponding contactless communication scheme (e.g., Type A, Type B, or Type F). In this embodiment, the term "communication characteristic" refers to an aspect of an IC chip which is specified according to a corresponding contactless communication scheme or applicable service, during contactless wireless communication with a reader/writer, such as a communication coverage distance, the presence or absence of a communication dead zone within a communication coverage area, and the width of a communication dead zone if any. For example, IC chips that are incorporated into IC cards for transport systems, such as IC tickets and the like, are typically designed to have a longer communication coverage distance for reception of radio waves from a reader/writer than that of IC chips that are incorporated into IC cards for payment systems for paying money for goods or service.

For example, it is assumed that the IC chip 120*a* is the former IC chip that is incorporated into IC cards for transport systems, such as IC tickets and the like, and the IC chip 120*b* is the latter IC chip that is incorporated into IC cards for payment systems for paying money for goods or service. The IC chips 120*a* and 120*b*, when receiving power that is generated by the coil 111 receiving radio waves from a reader/writer, sends information back to the reader/writer in response to information transmitted from the reader/writer.

As described above, there are standards for IC chips that specify communication characteristics required according to corresponding contactless communication schemes or applicable services. Among important aspects of standards for communication characteristics is a communication coverage distance. The communication coverage distance of an IC chip mainly depends on the amount of power received from the coil. When a plurality of IC chips and a coil antenna are connected so that power is equally supplied to the IC chips, then if the amount of power is adjusted so that IC chips for which a shorter communication coverage distance is required can receive an appropriate amount of power, IC chips for which a longer communication coverage distance is required fail to satisfy the communication coverage distance. Conversely, if the amount of power is adjusted so that IC chips for which a longer communication coverage distance is required can receive an appropriate amount of power, IC chips for which a shorter communication coverage distance is required receive an excessive amount of power.

Among techniques of supplying appropriate power to a plurality of IC chips is to provide the IC chips with respective coil antennas separately. Specifically, when two IC chips are incorporated, two coil antennas are incorporated. However, it is considerably difficult to incorporate a plurality of coil antennas into a device having a limited circuit area such as an electronic money card, a credit card, or the like.

With the above in mind, in the information processing device 100 according to an embodiment of the present disclosure, the two IC chips 120*a* and 120*b* are connected to the single coil antenna 110 as shown in FIG. 1. In the information processing device 100 according to an embodiment of the present disclosure, the IC chip 120*a* is connected to the opposite ends of the coil 111, and the IC chip 120*b* is connected to one end of the coil 111 and a predetermined point between the opposite ends of the coil 111, as shown in FIG. 1. In other words, the IC chip 120*a* is connected to the coil 111 so that the IC chip 120*a* receives all power generated by the coil 111. Meanwhile, the IC chip 120*b* is connected to the coil 111 so that the IC chip 120*b* receives a portion of the power generated by the coil 111.

Thus, in the information processing device 100 according to an embodiment of the present disclosure, the IC chips 120*a* and 120*b* connected in parallel to the coil antenna 110 receive different amounts of power from the coil 111. Thus, the IC chips 120*a* and 120*b* receive different amounts of power from the coil 111, and therefore, appropriate power can be supplied from the coil 111 according to communication characteristics required for the respective IC chips 120*a* and 120*b*.

Although, in the example shown in FIG. 1, the IC chip 120*a* is connected to the opposite ends of the coil 111, and the IC chip 120*b* is connected to one end of the coil 111 and a predetermined point between the opposite ends of the coil 111, the present disclosure is not limited to such an example.

[1.2. Advantageous Effect Example]

Figure 5:
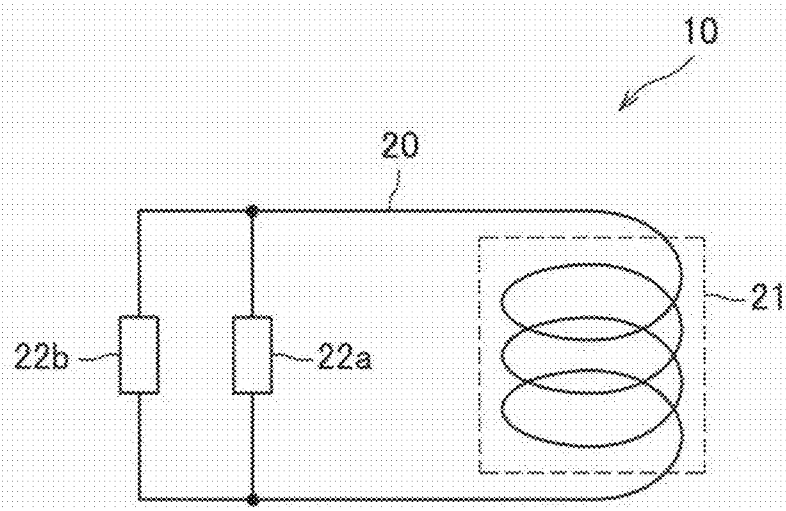
FIG. 5 is an illustrative diagram showing a configuration example of an information processing device according to a comparative example.

For example, assuming that the coil 111 is a three-turn coil where the number of turns is three, a case where the IC chips 120*a* and 120*b* are both connected to the third turn of the coil 111 as shown in FIG. 5, and a case where the IC chip 120*a* is connected to the third turn of the coil 111 while the IC chip 120*b* is connected to the second turn of the coil 111, are compared to show that, in the information processing device 100 according to an embodiment of the present disclosure, appropriate power can be supplied from the coil 111 to the IC chips 120*a* and 120*b* according to communication characteristics required for the respective IC chips 120*a* and 120*b*.

Table 1 shows an example in which a case (case 1) where the IC chips 120*a* and 120*b* are both connected to the third turn of the coil 111 as shown in FIG. 5, and a case (case 2) where the IC chip 120*a* is connected to the third turn of the coil 111 while the IC chip 120*b* is connected to the second turn of the coil 111 as shown in FIG. 1, are compared in terms of a communication coverage distance, in the presence of the same nearby reader/writer.

TABLE 1

(Table 1: Comparison of communication coverage distance)

| | IC chip 120a | IC chip 120b |
|---|---|---|
| Case 1 | 39 mm | 50 mm |
| Case 2 | 47 mm | 47 mm |

As shown in Table 1, when the IC chips 120*a* and 120*b* are both connected to the third turn of the coil 111 as shown in FIG. 5, the IC chip 120*b* has a communication coverage distance of 50 mm, and the IC chip 120*a* has a communication coverage distance of 37 mm. The difference in communication coverage distance is caused by a difference in characteristics between the operating circuits included in the IC chips 120*a* and 120*b*. Therefore, when the IC chips 120*a* and 120*b* are both connected to the third turn of the coil 111 as shown in FIG. 5, power cannot be supplied to the IC chips 120*a* and 120*b* according to communication characteristics required for the respective IC chips 120*a* and 120*b*. The reason why power cannot be supplied to the IC chips 120*a* and 120*b* according to communication characteristics required for the respective IC chips 120*a* and 120*b*, is that power received by the IC chips 120*a* and 120*b* is uniquely determined by characteristics of the operating circuits included in the IC chips 120*a* and 120*b*.

Meanwhile, as shown in Table 1, when the IC chip 120*a* is connected to the third turn of the coil 111 while the IC chip 120*b* is connected to the second turn of the coil 111 as shown in FIG. 1, the IC chips 120*a* and 120*b* can both have a communication coverage distance of 47 mm. In other words, in the information processing device 100 according to an embodiment of the present disclosure, if the IC chips 120*a* and 120*b* are connected to different points of the coil 111, power can be appropriately supplied to the IC chips 120*a* and 120*b* according to communication characteristics required for the respective IC chips 120*a* and 120*b*. Also, in the information processing device 100 according to an embodiment of the present disclosure, power can be appropriately supplied to the IC chips 120*a* and 120*b* according to communication characteristics required for the respective IC chips 120*a* and 120*b*, so that the communication characteristics required for the respective IC chips 120*a* and 120*b* connected to the coil antenna 110 can be satisfied.

[1.3. Specific Structure Examples]

Next, a specific circuit structure example will be described in which the information processing device 100 according to an embodiment of the present disclosure is incorporated into a card having a shape specified by a predetermined standard.

Figure 2:
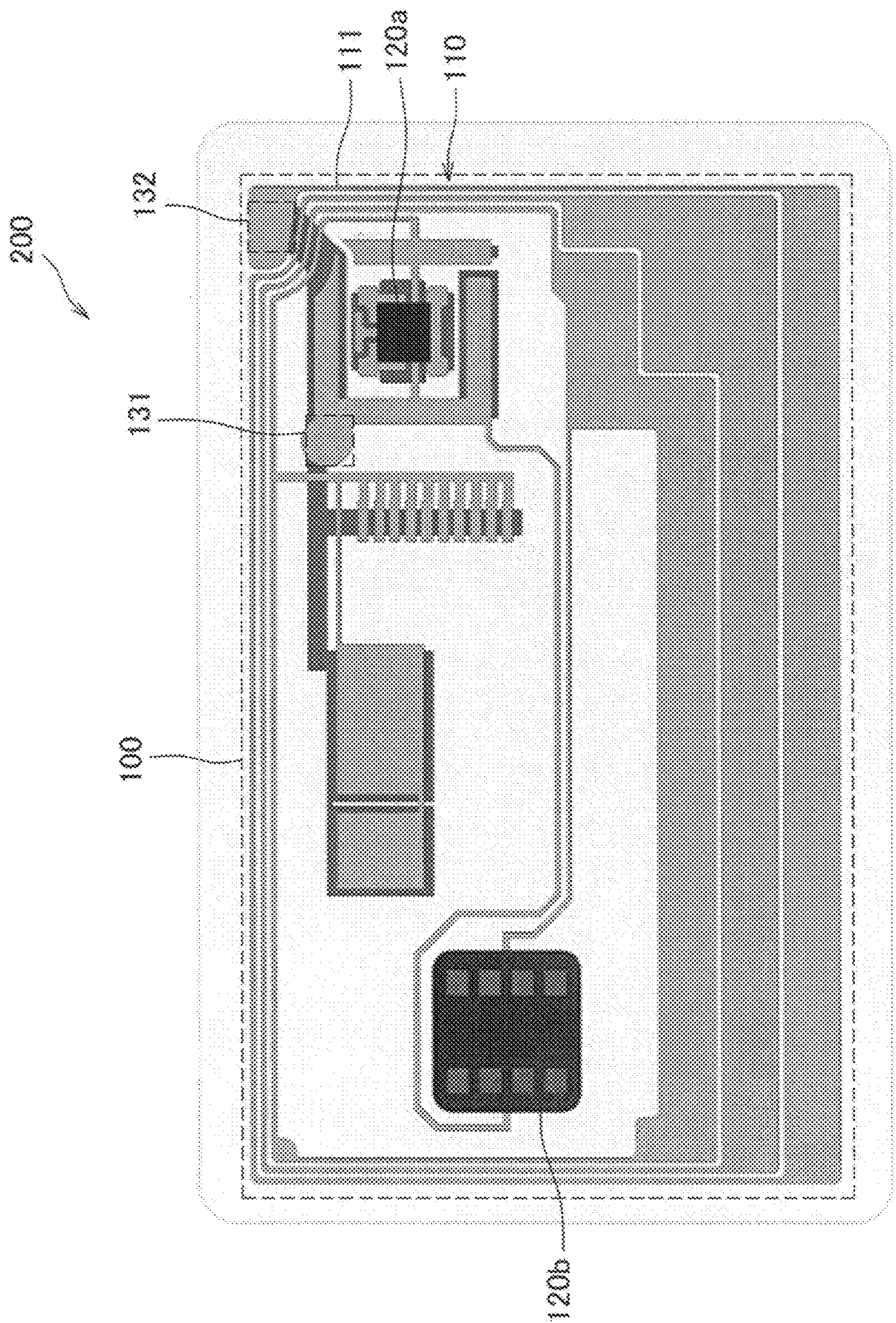
FIG. 2 is an illustrative diagram showing a specific configuration example of an information processing device according to an embodiment of the present disclosure.

FIG. 2 is an illustrative diagram showing a specific circuit structure example of the information processing device 100 according to an embodiment of the present disclosure. FIG. 2 shows a circuit structure example of the information processing device 100 in which the coil 111 that is a three-turn coil where the number of turns is three is formed by etching. An IC card is formed by covering the information processing device 100 shown in FIG. 2 with an outer material, such as a plastic card. Alternatively, the outer material may be the housings of other communication devices such as a mobile telephone and a smartphone, in addition to a card.

In the circuit example shown in FIG. 2, it is shown that the IC chip 120*a* is connected to the third turn of the coil 111, and the IC chip 120*b* is connected to the second turn of the coil 111. In other words, it can be seen that the information processing device 100 can be implemented so that the IC chip 120*a* and the IC chip 120*b* are connected to different points of the coil 111, and the IC chips 120*a* and 120*b* connected in parallel to the coil antenna 110 receive different amounts of power from the coil 111.

As to manufacture of IC cards including an IC chip, the position of the IC chip is typically specified by a standard. For example, in the circuit example shown in FIG. 2, the position of the IC chip 120*b* may be previously specified by a standard. Even when the position of an IC chip is thus previously determined, the information processing device 100 can be implemented so that a plurality of IC chips are connected to the coil antenna 110, and the IC chips 120*a* and 120*b* connected in parallel to the coil antenna 110 receive different amounts of power from the coil 111.

Also, when the coil 111 is formed by etching as shown in FIG. 2, then if embossing is performed in order to print characters on the IC card, the embossing can be performed with the characters overlying the coil portion. In particular, when it is, for example, required that four rows of characters are printed by embossing in a region 2 specified by JIS X 6302, such a requirement can be satisfied by the information processing device 100 having the circuit layout shown in FIG. 2.

Note that the circuit layout in which the coil 111 that is a three-turn coil where the number of turns is three is formed by etching, is not limited to that shown in FIG. 2. However, for example, if the coil 111 having the pattern shown in FIG. 2 is formed, only two crimping points 131 and 132 are required. Typically, an increase in the number of crimping points leads to a decrease in reliability of an information processing device that is incorporated into an IC card. However, the information processing device 100 shown in FIG. 2 can be implemented so that the IC chips 120*a* and 120*b* connected in parallel to the coil antenna 110 receive different amounts of power from the coil 111 without a decrease in reliability which is caused due to an increase in the number of crimping points.

Figure 3:
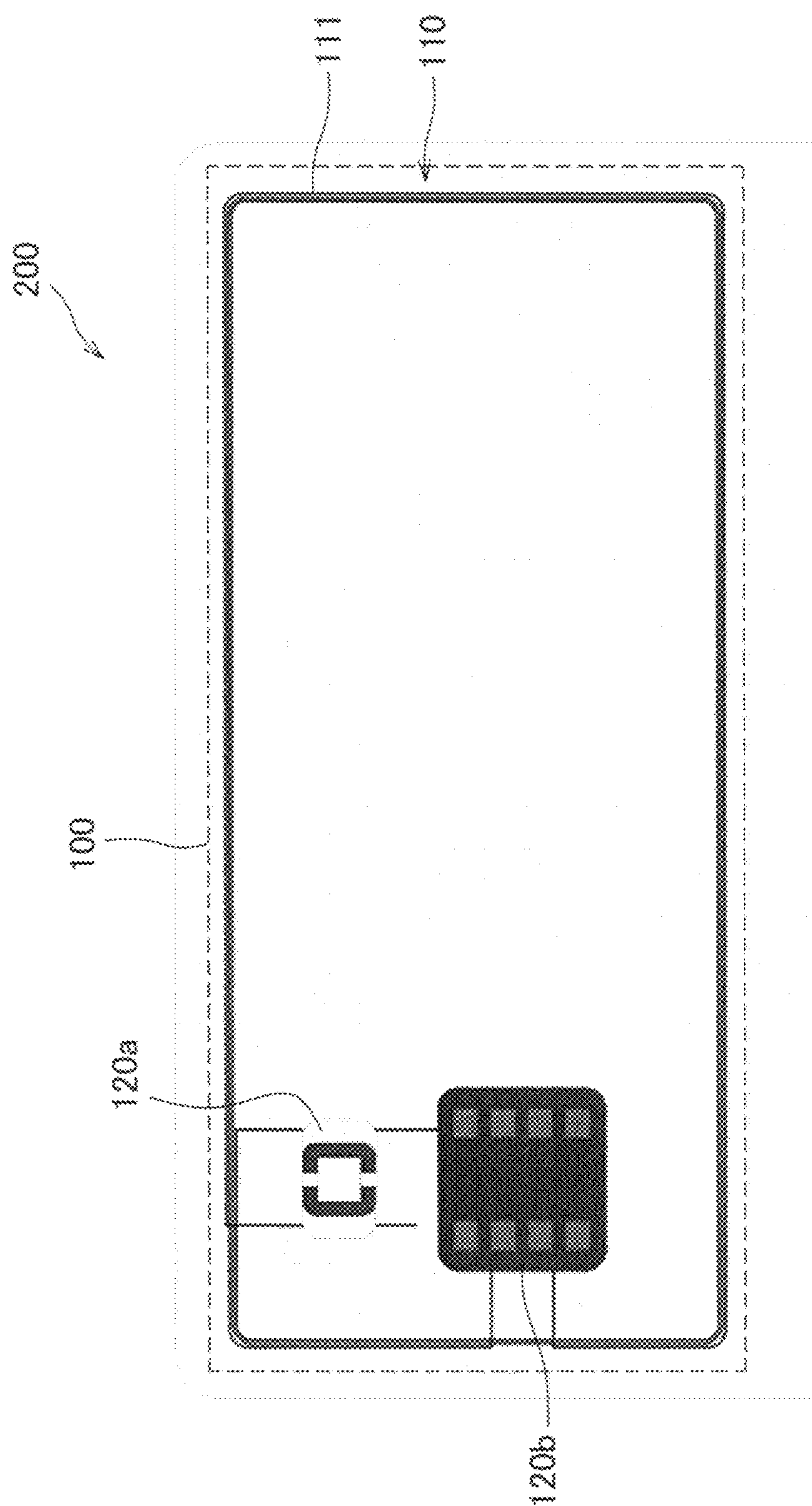
FIG. 3 is an illustrative diagram showing a specific configuration example of an information processing device according to an embodiment of the present disclosure.

Another specific circuit structure example of the information processing device 100 according to an embodiment of the present disclosure will be described. FIG. 3 is an illustrative diagram showing a specific circuit structure example of the information processing device 100 according to an embodiment of the present disclosure. FIG. 3 shows a circuit structure example of the information processing device 100 in which the coil 111 that is a three-turn coil where the number of turns is three is provided in the form of a wire antenna.

In the circuit example shown in FIG. 3, the IC chip 120*a* is connected to the third turn of the coil 111, and the IC chip 120*b* is connected to the second turn of the coil 111. In other words, it can be seen that the information processing device 100 can be implemented so that the IC chip 120*a* and the IC chip 120*b* are connected to different points of the coil 111, and the IC chips 120*a* and 120*b* connected in parallel to the coil antenna 110 receive different amounts of power from the coil 111.

Although FIGS. 2 and 3 show examples in which the information processing device 100 according to an embodiment of the present disclosure is incorporated into a card having a shape specified by a predetermined standard, the present disclosure is not limited to such an example. For example, when the information processing device 100 including a plurality of IC chips having a contactless communication function is incorporated into an electronic device such as a mobile telephone, a smartphone, or the like, the coil antenna 110 that is an antenna formed by etching as shown in FIG. 2 or FIG. 3, or a wire antenna, can be employed.

2. CONCLUSION

As described above, according to an embodiment of the present disclosure, the information processing device 100 is provided in which a plurality of IC chips having a contactless communication function are connected to a single coil antenna, and the IC chips receive different amounts of power from the coil of the coil antenna. In the information processing device 100 according to an embodiment of the present disclosure, power is appropriately supplied by the single coil antenna to each of the plurality of IC chips. Specifically, in the information processing device 100 according to an embodiment of the present disclosure, the different IC chips receive different amounts of power generated by the coil as shown in FIG. 1.

In the information processing device 100 according to an embodiment of the present disclosure, in order to allow the different IC chips to receive different amounts of power generated by the coil, for example, the IC chip 120*a* is connected to the opposite ends of the coil 111, and the IC chip 120*b* is connected to one end of the coil 111 and a predetermined point between the opposite ends of the coil 111.

In the information processing device 100 according to an embodiment of the present disclosure, the different IC chips receive different amounts of power generated by the coil, and therefore, appropriate power can be supplied from the coil to the IC chips according to communication characteristics required for the respective IC chips. Also, a single coil antenna can be used to supply appropriate power from the coil to the IC chips according to communication characteristics required for the respective IC chips, and therefore, the information processing device 100 according to an embodiment of the present disclosure can be incorporated into a small-size device in which the circuit area is severely limited, such as a card or the like.

The information processing device 100 according to an embodiment of the present disclosure can be produced by, for example, using the coil antenna 110 including the coil 111 which is a three-turn coil where the number of turns is three, that is formed by etching, as shown in FIG. 2. If the coil antenna 110 is formed by etching as shown in FIG. 2, a plurality of IC chips can be incorporated into a device into which the information processing device 100 according to an embodiment of the present disclosure is incorporated, such as an IC card, without impairing the flexibility of layout design.

Similarly, the information processing device 100 according to an embodiment of the present disclosure can be produced by, for example, using the coil antenna 110 including the coil 111 which is a three-turn coil where the number of turns is three, that is provided in the form of a wire antenna, as shown in FIG. 3.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, in the above embodiments, the IC chips 120*a* and 120*b* are both connected to the same one end of the coil antenna 110. The present disclosure is not limited to this example, if the different IC chips receive different amounts of power generated by the coil. For example, one IC chip may be connected to the opposite ends of the coil, and another IC chip may be connected to points in the middle of turns of the coil instead of the opposite ends.

In addition, the effects described in the present specification are merely illustrative and demonstrative, and not limitative. In other words, the technology according to the present disclosure can exhibit other effects that are evident to those skilled in the art along with or instead of the effects based on the present specification.

Additionally, the present technology may also be configured as below.

(1) An information processing device including:

a coil antenna configured to receive an external magnetic field and thereby generate power; and a first IC chip and a second IC chip each connected in parallel to the coil antenna and configured to receive power supplied from the coil antenna, wherein power received by the first IC chip from the coil antenna is different from power received by the second IC chip from the coil antenna.

(2) The information processing device according to (1), wherein the first IC chip receives power from a whole of the coil antenna, and the second IC chip receives power from a portion of the coil antenna.

(3) The information processing device according to (2), wherein the first IC chip is connected to the coil antenna so that the number of turns of the coil antenna for the first IC chip is greater than the number of turns of the coil antenna for the second IC chip.

(4) The information processing device according to any of (1) to (3), wherein the coil antenna is an etched antenna formed by etching.

(5) The information processing device according to (4), wherein one of the first IC chip and the second IC chip is connected to an innermost portion of the etched antenna.

(6) The information processing device according to any of (1) to (3), wherein the coil antenna is formed of a wire.

(7) The information processing device according to any of (1) to (6), wherein a communication characteristic of the first IC chip is different from a communication characteristic of the second IC chip.

(8) The information processing device according to (7), wherein the communication characteristic is a distance within which communication is allowed when power is received from the coil antenna.

(9) The information processing device according to any of (1) to (8), wherein a connection point at one end of the coil antenna is common to the first IC chip and the second IC chip.

(10) A communication device including:

a coil antenna configured to receive an external magnetic field and thereby generate power;

a first IC chip and a second IC chip each connected in parallel to the coil antenna and configured to receive power supplied from the coil antenna; and an outer material configured to cover the coil antenna and the two or more IC chips, wherein power received by the first IC chip from the coil antenna is different from power received by the second IC chip from the coil antenna.

REFERENCE SIGNS LIST

100 information processing device
110 coil antenna
111 coil
120*a*, 120*b* IC chip
131, 132 crimping point

The invention claimed is:

1. An information processing device, comprising:

a coil antenna configured to:
receive an external magnetic field, and
generate a first power based on the external magnetic field; and a first IC chip and a second IC chip connected to the coil antenna,
wherein the first IC chip is parallel to the second IC chip,
wherein the first IC chip and the second IC chip are configured to receive a second power and a third power, respectively,
wherein each of the second power and the third power is supplied from the coil antenna, and
wherein the second power received by the first IC chip from the coil antenna is different from the third power received by the second IC chip from the coil antenna.

2. The information processing device according to claim 1, wherein the first IC chip is further configured to receive the second power from a whole of the coil antenna, and the second IC chip is further configured to receive the third power from a portion of the coil antenna.

3. The information processing device according to claim 2, wherein the first IC chip is connected to the coil antenna so that a first number of turns of the coil antenna for the first IC chip is greater than a second number of turns of the coil antenna for the second IC chip.

4. The information processing device according to claim 1, wherein the coil antenna is an etched antenna.

5. The information processing device according to claim 4, wherein one of the first IC chip or the second IC chip is connected to an innermost portion of the etched antenna.

6. The information processing device according to claim 1, wherein the coil antenna comprises a wire.

7. The information processing device according to claim 1, wherein a first communication characteristic of the first IC chip is different from a second communication characteristic of the second IC chip.

8. The information processing device according to claim 7, wherein at least one of the first communication characteristic or the second communication characteristic is a distance within which a communication is allowed, and wherein the communication is based on at least one of the second power or the third power received from the coil antenna.

9. The information processing device according to claim 1, wherein the first IC chip and the second IC chip are connected to one end of the coil antenna.

10. A communication device, comprising:

a coil antenna configured to:
receive an external magnetic field, and
generate a first power based on the external magnetic field;

a first IC chip and a second IC chip connected to the coil antenna, wherein the first IC chip is parallel to the second IC chip, wherein the first IC chip and the second IC chip are configured to receive a second power and a third power, respectively, and wherein each of the second power and the third power is supplied from the coil antenna; and an outer material configured to cover the coil antenna, the first IC chip, and the second IC chip, wherein the second power received by the first IC chip from the coil antenna is different from the third power received by the second IC chip from the coil antenna.

* * * * *